United States Patent [19]
Johnson et al.

[11] Patent Number: 5,893,899
[45] Date of Patent: Apr. 13, 1999

[54] METHOD AND APPARATUS FOR THE DISPLAY OF DIGITIZED ANALOG SIGNAL LOSS

[76] Inventors: William J. Johnson, 1445 Sedalia Dr., Flower Mound, Tex. 75028; Guillermo Vegatoro, 2100 Grayson Dr. #417, Grapevine, Tex. 76051; Larry M. Lachman, 6304 N. MacArthur Blvd. #1019, Irving, Tex. 75039; David Flores, 1401 Bur Oak Ct., Keller, Tex. 76248

[21] Appl. No.: 08/804,865

[22] Filed: Feb. 24, 1997

Related U.S. Application Data

[63] Continuation of application No. 08/335,949, Nov. 8, 1994, Pat. No. 5,610,825.
[51] Int. Cl.[6] .................................................. H03M 7/00
[52] U.S. Cl. ........................ 702/76; 341/122; 341/123
[58] Field of Search .............................. 702/76; 341/122, 341/123–125; 364/725.01–726.03

[56] References Cited

U.S. PATENT DOCUMENTS

| | | | |
|---|---|---|---|
| 4,763,207 | 8/1988 | Podolak et al. | 360/32 |
| 4,816,829 | 3/1989 | Podolak et al. | 341/122 |
| 4,823,090 | 4/1989 | Coleman et al. | 328/114 |
| 4,893,341 | 1/1990 | Gehring | 381/7 |
| 5,119,093 | 6/1992 | Vogt et al. | |
| 5,220,583 | 6/1993 | Solomon | 375/82 |
| 5,302,950 | 4/1994 | Johnson et al. | 341/123 |
| 5,610,825 | 3/1997 | Johnson et al. | 364/485 |

*Primary Examiner*—Kamini Shah
*Attorney, Agent, or Firm*—Gunn & Associates, P.C.

[57] ABSTRACT

A method and apparatus for sampling an analog signal permits the identification of those samples in which data was lost in the sampling process. A data reference element is generated for each sample element, the data reference element having a corresponding sample element. A user friendly display technique is provided to permit the user to controllably display the sampled signal, clearly showing those portions of the signal in which information was lost contrasted with those portions of the signal that were sampled intact.

13 Claims, 9 Drawing Sheets

5,893,899

METHOD AND APPARATUS FOR THE DISPLAY OF DIGITIZED ANALOG SIGNAL LOSS

This application is a continuation of application Ser. No. 08/335,949, filed Nov. 8, 1994, U.S. Pat. No. 5,610,825, issued Mar. 11, 1997.

FIELD OF THE INVENTION

The present invention relates generally to the field of data processing systems, and in particular to a method of, and apparatus for, identification of the occurrence of signal loss from a sample when a digitized analog signal is stored.

BACKGROUND OF THE INVENTION

When a band-limited analog signal is digitally sampled with a sampling rate that is less than the minimum required rate for the exact reconstruction of the analog signal from its digital samples (the Nyquist rate), information loss occurs. This results in a degradation of signal quality when the digital signal is converted back to analog form. A method is desired that will let the user of an analog signal sampling device view in which parts of the analog signal information loss occurs (when a signal is sampled at a rate below the minimum rate required for maximum fidelity—i.e. by the Nyquist rate).

Information loss occurs at those time intervals of the analog signal which contain frequency components higher than half the sampling rate used. The Nyquist theorem states that in order to exactly reconstruct an analog signal from its digital samples, the sampling rate used must be greater than, or equal to, two times the maximum frequency component present in the band-limited signal. For example, if the maximum frequency component present in an analog signal is 250 kHz, then the signal must be sampled at a minimum of 500 kHz in order to be able to recover the signal from its samples without any information loss.

An analog signal X(t) (see FIG. 5) can be broken up into a summation of many "time-sliced" signals $X_i(t)$. Each time-slice of the signal can be treated as an individual analog signal to be sampled at the given sampling rate. The frequency contents of the time-slice can be obtained through a spectrum analyzer. If the maximum frequency present in a particular sample is greater than half of the rate used to sample the signal, then information loss has occurred for that sample or time-slice. A table in which each entry corresponds to a time-slice can be dynamically built by an analog to digital sampling device to identify those time intervals in which information loss has occurred. Another process can read the table and then display, in a user-friendly manner, where in the signal information loss occurred.

An audio signal defines such an analog signal. An audio signal, divided in time into a series of time-slices, may be thought of as a discreet series of "snap-shots" of the audio signal. Similarly, a video signal may be thought of as sampled into a discreet series of frames of the total signal. For any audio or video signal, only certain portions will experience information loss when the frequency content of a snap-shot of frame exceeds the Nyquist rate. Thus, there remains a need for a simple, user-friendly means of displaying to a user which snap-shot or frame experienced data loss in the digital sampling procedure. Further, such a system should provide additional means of illustrating how much of the analog signal was lost in a particular snap-shot or frame so that a determination can be made as to the acceptability of the degree of information loss.

SUMMARY OF THE INVENTION

The present invention solves these and other shortcomings of the prior art by developing a marker for each time-slice of the analog signal. The marker, comprising the maximum frequency in the time-slice and an offset to associated time-slice data in a sample file, identifies those time-slices in which data was lost in the sampling process. Then, using common navigation techniques, the user is permitted to peruse the signal, visually and audibly, to determine if data loss is acceptable or not.

These and other features and objects of the present invention will be apparent to those of skill in the art from a review of the following detailed description along with the drawing figures.

BRIEF DESCRIPTION OF THE DRAWINGS

For a more complete understanding of the present invention and the features and advantages thereof, reference is now made to the Detailed Description in conjunction with the attached Drawings, in which.

DETAILED DESCRIPTION OF A PREFERRED EMBODIMENT

Structure of the Present Invention

Figure 1:
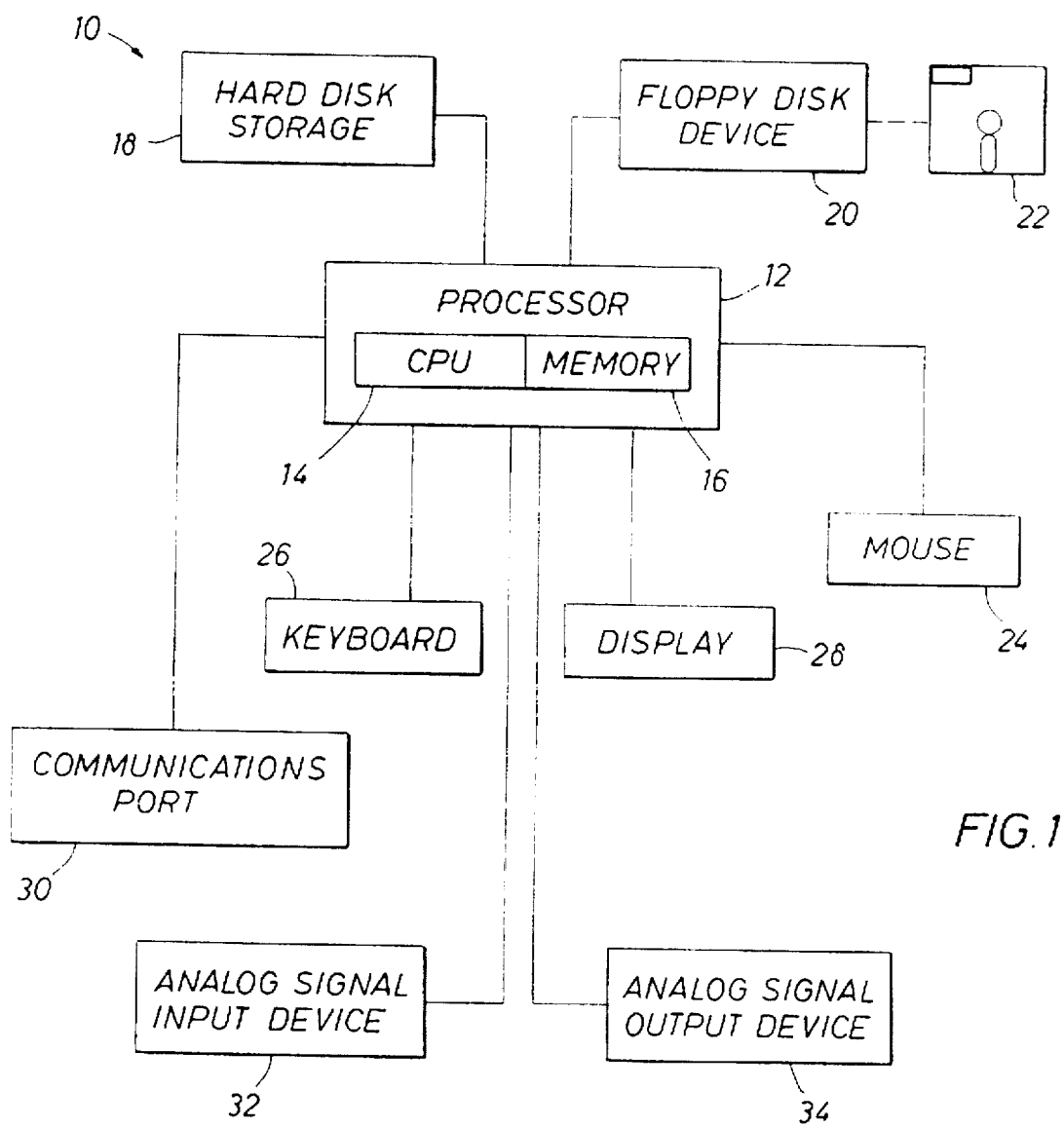
FIG. 1 is a block diagram of a data processing system used in performing the method of the present invention and forming part of the apparatus of the present invention.

First, FIG. 1 depicts a block diagram of a data processing system 10 in which the present invention finds useful application. The data processing system 10 includes a processor 12, which includes a central processing unit (CPU) 14 and a memory 16. Additional memory, in the form of a hard disk file storage 18 and a floppy disk device 20, is connected to the processor 12. Floppy disk device 20 receives a diskette 22 which has computer program code recorded thereon that implements the present invention in the data processing system 10.

The data processing system 10 may include user interface hardware, including a mouse 24 and a keyboard 26 to allow a user access to the processor 12 and a display 28 for presenting visual data to the user. The data processing system 10 may also include a communications port 30 for communicating with a network or other data processing systems. The data processing system 10 may also include analog signal devices, including an analog signal input device 32 for entering analog signals into the data processing system 10, and an analog signal output device 34 for reproducing analog signals.

Figure 2:
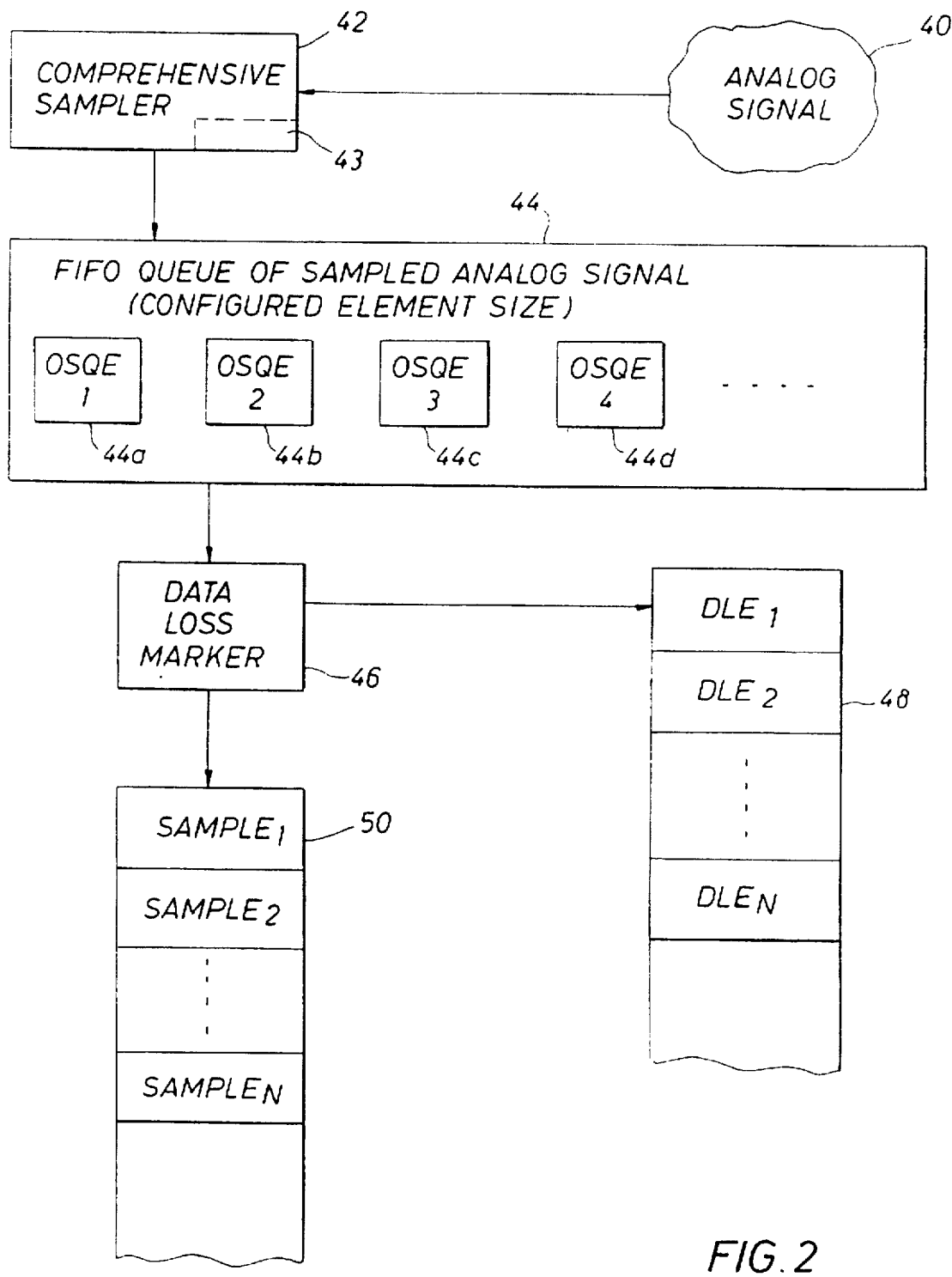
FIG. 2 is a block diagram of a system incorporating the present invention including means for identifying portions of an analog signal that are lost in the sampling process.

Referring now to FIG. 2, an analog signal 40, which may represent sound or a video signal for example, is developed from some source. The analog signal is detected and sampled by a comprehensive sampler 42 at a predetermined sampling rate $S_{SA}$. The sampler 42 provides a digital signal to a memory 44 which represents a FIFO register or queue. The comprehensive sampler also may include a means 43 of detecting the highest frequency component for each sample portion read into the memory 44. The means 43 of detecting the highest frequency component may alternatively be a separate element apart from the spectrum analyzer of the sampler 42.

Figure 5:
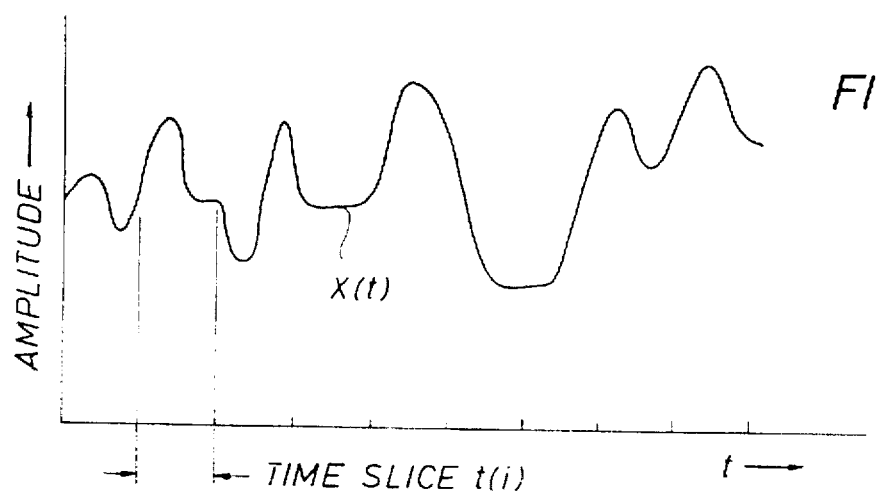
FIG. 5 is a plot of the analog signal over time to illustrate the meaning of a time-slice of the signal.

The memory 44 may also be referred to as the "Original Sample Queue" since the data entered therein is the unaltered original digital sample. The original sample is sequentially and periodically read into original sample queue entry (OSQE) elements 44a, 44b, 44c, etc. Each element represents a time-slice or period of individual samples of the analog signal. The time-slice is configurable and effects the OSQE size. For example, the configured time-slice may be 5 seconds, while sample data collected for the time-slice consists of smaller, nanosecond time-slice samples contained in a single entry. In other words, each OSQE entry may comprise one or many samples from the comprehensive sampler. As shown in FIG. 5, an OSQE may be the sample t(i) or it may be $t(i)_1$ through $t(i)_{100}$, for example.

It should be appreciated that this operation is conducted "on the fly" since, as samples are read into the entry elements 44a, 44b, 44c, etc., the oldest of these samples is also being read out for further manipulation by a data loss marker 46.

As previously stated, original samples are placed on the FIFO queue 44 by the sampler 42. As each sample is read off the queue, a determination is made as to whether there was a loss of information in that sample or not due to the fact that $S_{SA}$ is less than the Nyquist rate. If there was a loss of information, an offset is written to a Data Loss or Reference Table 48 of the first byte in that sample. The length of the data element is known from the size of the output buffer of the FIFO queue 44.

Figure 4:
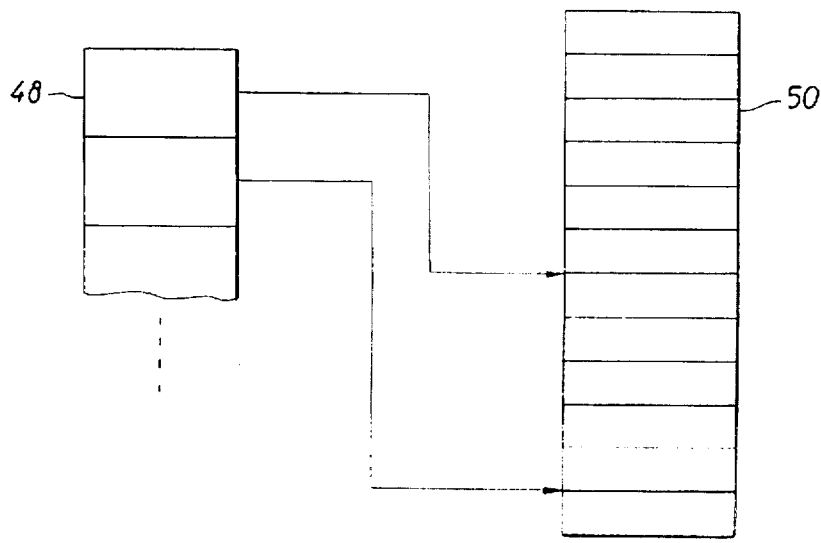
FIG. 4 is a block diagram illustrating the correspondence of lost data to the file which stores the sampled signal.

Each OSQE includes three fields: (1) the maximum frequency $F_{max}$ of the analog signal in that sample; and (2) sample data representing the digitized analog signal. As each OSQE is read out to the data loss marker 46, the marker 46 compares the $F_{max}$ field with the known sampling rate $S_{SA}$ to determine if a loss of information has occurred. Then, for each OSQE, an entry is made into each of data reference table 48 and a sample file 50. Each entry in the data reference table 48, e.g. $DLE_1$, $DLE_2$, etc., includes $F_{max}$ and a sample file offset, signifying whether or not there was data loss in that sample. Each entry in the sample file 50, e.g. $SAMPLE_1$, $SAMPLE_2$, etc., is simply the digital representation of each time-slice. Thus, each entry in the data reference table 48 serves as a pointer into a corresponding sample file entry, indicating the presence or absence of data loss, as shown in FIG. 4.

Both files, (i.e., the data reference table 48 and digital output or sample file 50) are associated to the input signal. The preferred embodiment comprises two files with the same name and different extensions in order to facilitate identity correlation. It should also be noted that the data loss marker 46 may include data compression to maximize the use of available data storage space in the sample file 50, if over-sampling has occurred for a specific time-slice. On the other hand, a constant sample rate over the entire sample file enables the digital information in the file to be played on conventional devices.

Figure 3:
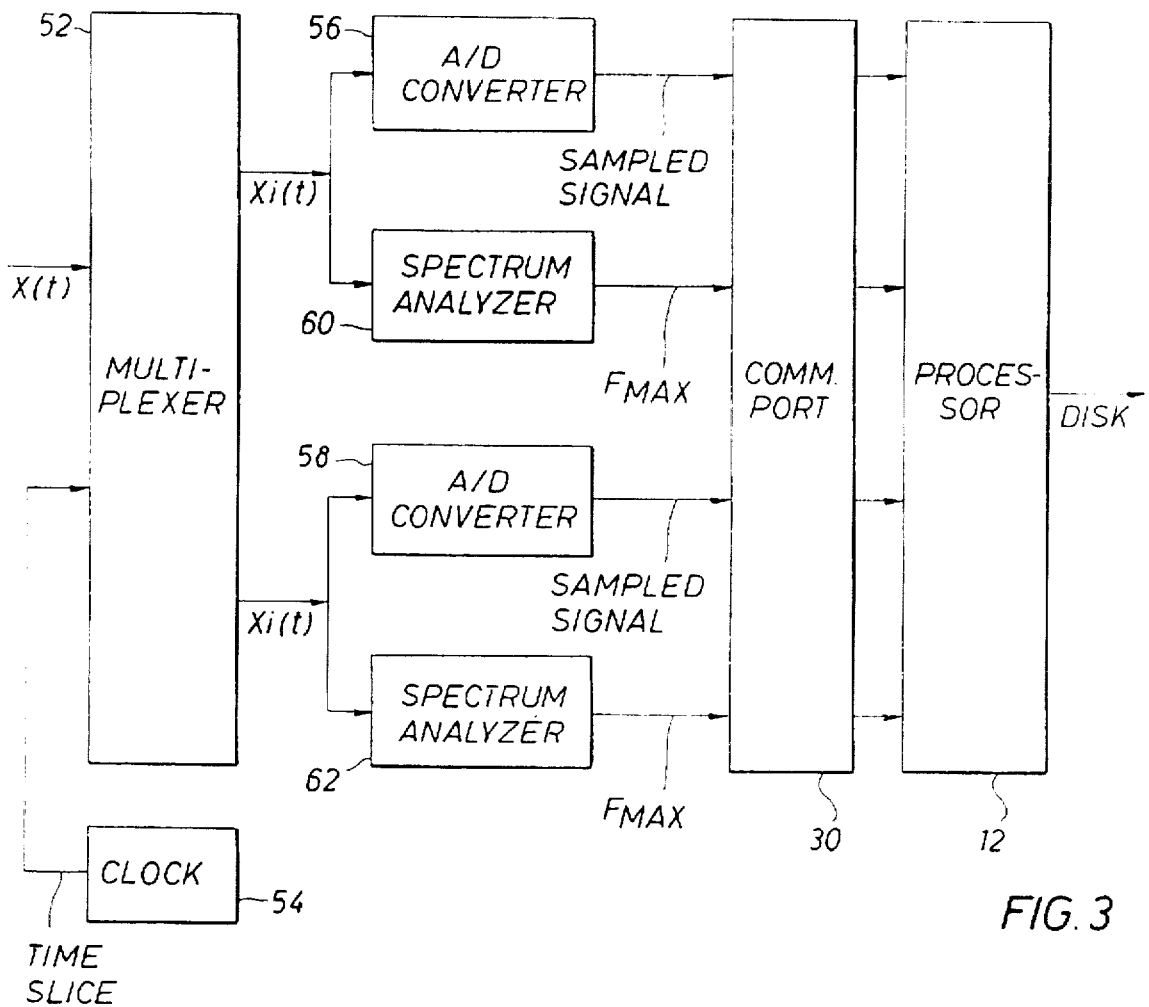
FIG. 3 is a block diagram of the sampling elements of the present invention that develop the data structure to identify portions of the signal X(t) that are lost in the digital sampling process.

FIG. 3 depicts a block diagram of a preferred embodiment of the sampling portion of the structure of the present invention. A multiplexer 52 divides the signal into time-slices by routing the signal through two or more channels for the duration of a selected time interval. (Also see FIG. 5.) The multiplexer 52 alternates between the channels in order to provide multi-tasking by starting the sampling of the next time-slice while the previous time-slice is finishing. The frequency and duration of the time-slices is dictated in part by a clock 54 in a known fashion.

An analog-to-digital (A/D) converter 56, 58 in each channel samples the analog signal into digital values using the predetermined sampling rate. Also in each channel, a spectrum analyzer 60, 62 determines the frequency content of the time-sliced signal and saves to the data reference table 48 the maximum frequency found in each time-slice.

Each channel thus provides a digital representation of the sampled time-slice (i.e., the sampled signal) and a number representing the maximum frequency, $F_{max}$, in that time-slice. These signals are provided to the communications port 30 and delivered to the processor 12. The processor 12 includes the data loss marker 46 which compares the sampling rate used ($S_{SA}$) with the maximum frequency found in the time-sliced signal. If the maximum frequency component is greater than half the sampling rate, an offset value is inserted into the data reference table 48 which points to the first byte (which is offset (e.g. bytes) from the beginning of the file) of the samples in the sample file 50 obtained for that time-slice.

Graphical User Interface

Having reviewed a preferred embodiment of the structure of the present invention and in order to fully appreciate the capabilities of this structure, examples of a preferred user interface will now be presented.

Up to now, the detail description has shown how to sample an analog signal and develop data files to identify for later viewing those portions of the analog signal that suffered data loss in the sampling process. The following description shows how the data files are displayed to the user and describes some of the user selectable options.

In addition to the data loss marker 46 which identifies and "marks" the loss of information, the data reference table file 48 and the digital output (sample) file 50 are used by another process called the graphical correlation process (GCP) in the processor 12 which provides the end user interface to "show" the user where information loss occurred. The GCP runs independently of any other processes of the present invention.

The GCP works with the data reference table file 48 and the digital output sample file 50. The records in the data reference table 48 are used to map to corrupted time-slices in the sample file 50 during user perusal. The user can then decide whether or not the information loss is acceptable. Presentation to the user of the loss of information in a sound or video signal in a multimedia environment is implemented in the GCP.

The GCP graphs signal amplitude (value in a sample) over time as distinct bars per time-slice. Bars on the graph are color coded to indicate which time-slice contains a loss of information. Each time-slice correlates to a segment of the sound signal, in the case of audio, or an individual frame, in the case of video. The user is able to select time units (e.g. nanoseconds, milliseconds, seconds, minutes, etc.) and an amplitude count for units on the X axis and Y axis, respectively. The graph dynamically scales itself accordingly.

The user is also able to select any of the time-slice bars with a mouse selection to transpose directly to the associated signal. In the case of sound, the interface permits playing the snapshot of time with leading and following time played before and after the associated sound snapshot. This allows the user to listen for a difference among neighboring samples. The user may also play with a starting point according to the selected bar. The data reference table is used to construct the color coding scheme of the bars in the graph.

The interface which is transposed further allows the user to navigate in a manner known in the art. For example, the user navigates through a sound recording with fast forward, rewind, etc. The user is also able to immediately transpose back to the last previous portion of the graph that was viewed. When returning to the graph, an arrow appears to the corresponding graph bar (i.e., time-slice) which corresponds to the snapshot in time (video frame; sound snapshot) of where the user had invoked going back.

Another feature of the present invention is used to play a sound signal normally and display a visual indicator (like a flag or an animated icon) during corrupted time-slices. The bar graph is still displayed and scrolled forward as the signal is played. The user can stop the playing and move forward or backwards by using the bar graph navigation method discussed above. This method would be the preferred way for those skilled in the art since the information loss is better appreciated by listening to a continuous signal rather than to small segments of the signal.

It is important to note that a corrupt frame or sequence of frames may still be acceptable for a particular user. In fact, signal time-slices may be insignificantly corrupted. This invention supports user control for setting an acceptable percentage of the Nyquist rate (e.g. $F_{max}$ is 5% over Nyquist) as a threshold for acceptable information loss.

Refer now to FIGS. 6(a)–6(f) and 7(a)–7(f), which depict examples of the graphical user interface of the present invention. "Option" in the OPTIONS interface is a configurable control that supports the user's preference for what is acceptable. The maximum frequency value in a data loss entry is compared to the toleration for appropriate color coding. This permits the display of the percent of the ideal sampling rate, the Nyquist rate, to show the fraction of unadulterated data. The data reference table contains a maximum frequency component which was present in time-slices pointed to by the data reference table offset. The bar graph bars are instantly and dynamically updated to reflect the user preference.

The data reference table file and the digital output file are also used by another independent process referred to herein as the Signal Navigation Process (SNAP). SNAP allows replaying the signal and having the video automatically stop at the first frame of differing fidelity than the current frame (i.e. stop at a corrupted frame if on good frame; stop at good frame if at a corrupt frame). When first starting to play the video, frames are assumed good so that the first corrupt frame encountered is automatically stopped at.

As used herein, the terms "differing fidelity" and "change in fidelity" are used to mean a change from a portion of the signal when no data was lost ("uncorrupted" or "unadulterated") to a portion in which data was lost ("corrupted" or "adulterated"), and vice versa.

The user can then study the frame and use a graphical user interface to query the maximum frequency present in the video frame, the sampling rate used, and the sampling rate that will cause no loss of information (all from the record associated to the video frame in the data reference table file). The user can then select a "Continue" option on the graphical user interface to continue viewing the video output of other frames. In addition, a "Next Frame" function on the graphical user interface allows the user to move directly to the video frame for inspection. An analogous "Previous Frame" push-button is used to move directly to the previous video frame. Analogously, a "Next Contrasting Frame" and "Previous Contrasting Frame" function is employed. As used herein, the term "contrasting" means the next frame of a different discreet fidelity. This allows jumping immediately to the next good or corrupt frame depending on the fidelity of the current frame when the "Next" function is invoked.

The video will automatically stop when a discreet change in fidelity occurs between frames (good or corrupt) and in a navigation mode for information loss perusal.

FIGS. 6(a)–6(f) shows six desktops, Desktop 6(A) through 6(F). This invention is invoked with either a command from a command line or launched from a customary graphical interface. Upon invocation, Desktop 6A shows a panel results with a set of functions available, e.g. forward, reverse, and an options selection, as shown. At initial startup, there is no video yet shown in the video window. Those skilled in the art recognize the interface described will preferably contain a panel with a minimize/maximize function, title bar, and other customary features. The example does not show those details in the interest of clarity.

The window can be resized so that the video image will be scaled appropriately based on the panel and window size. As mentioned, a variety of user interface embodiments may be implemented without departing from the spirit and scope of the invention. Special keyboard and/or hot key functions can accompany the mouse operated menus. The OPTIONS selection allows a user to perform various navigation functions well known in video navigation art (i.e., forward play, reverse play, fast forward, fast reverse, etc.).

Of interest to this invention, OPTIONS also provides means for selecting a file to view. When a source video file is selected, it and the associated data reference table are read. The data reference table is compared with where the video navigation pointer currently points, so there is a means to know if there is information loss even though there may not appear to be. A loss indicator displays to the user whenever a loss is detected in a frame.

Desktops 6(A) and 6(B) show a flag for a loss indicator embodiment. Every frame with a loss will display a flag 70 which is configurably placed (part of OPTIONS) anywhere on or next to the video frame. Of course, various indicator embodiments are permitted. The video can be navigated through (forward or reverse, fast or slow) in the conventional manner but will automatically stop at the first encountered frame in a sequence of frames which has lost information from the original signal when in a "show loss of information mode" (using OPTIONS).

Any time the user selects an area within the video display window with the mouse, the video resumes play. Keyboard commands and/or hot keys may also be implemented as supplements. OPTIONS should permit a next frame and previous frame function for individual frame perusal. When the video resumes play in the current direction (and speed selected in OPTIONS), the video will automatically stop when a discreet change of frame fidelity occurs. If perusing frames of fidelity, the video will automatically stop at the first corrupted frame encountered. If perusing a corrupted sequence of frames, the video will automatically stop at the first good frame. This allows the user to know a change has occurred in the video.

The loss indicator will indicate whether or not the frame is corrupted. The user may select either the forward or reverse button to immediately scan to the next frame change of fidelity in the respective direction while in CONTRAST mode. CONTRAST mode forward and reverse buttons, pressed at any time during video navigation states, jump to the next change in video quality (i.e., if currently at video portion with fidelity, then jumps to first corrupted frame in same direction of current video navigation; if currently at corrupted frame of video, then jumps to first frame with fidelity in same direction of current video navigation). The forward and reverse buttons apply to jump to discreet fidelity change when in an OPTIONS navigation mode for show loss of information.

Figure 6A:
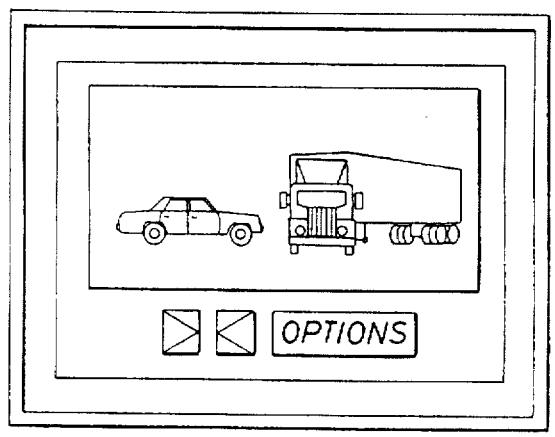
FIGS. 6(a)–6(f) are a depiction of a series of screens illustrating one method of displaying the identification of lost information from a video signal.
Figure 6B:
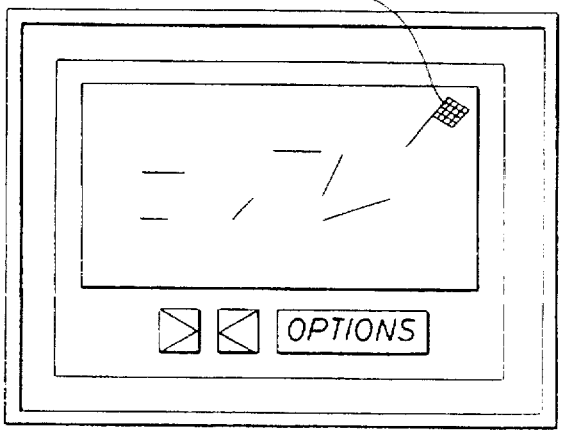
Figure 6C:
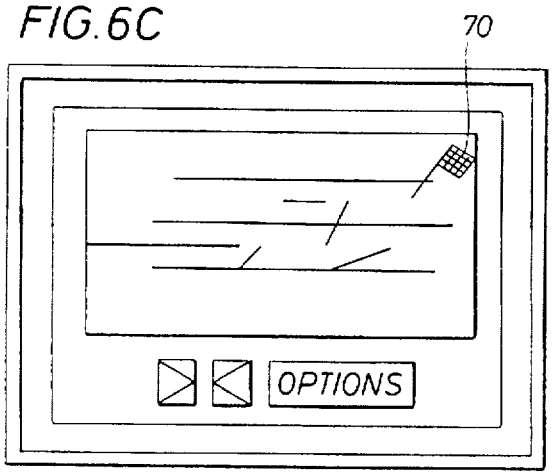
Figure 6D:
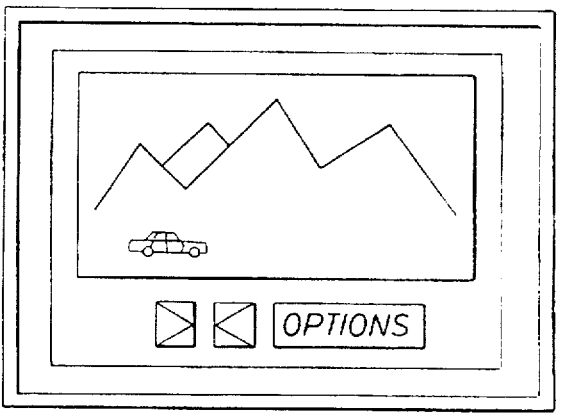
Figure 6E:
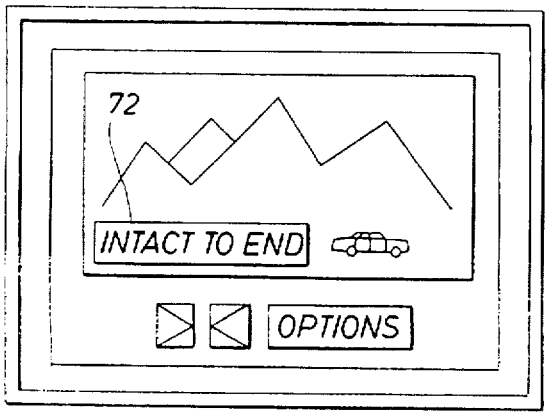
Figure 6F:
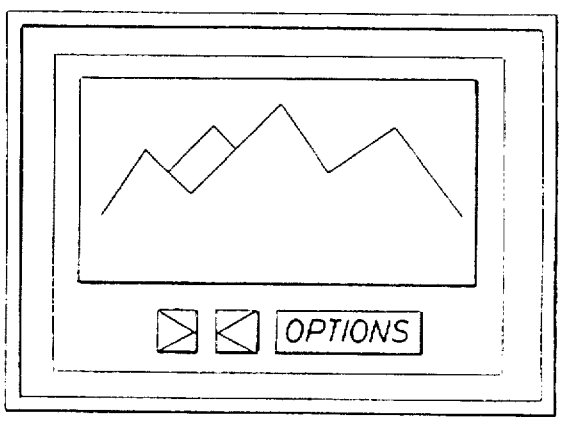

In FIG. 6(A) shows the user started a video from disk and is watching it play forward. Assuming the video plays on, Desktop 6(B) shows the video automatically stopped on the first frame detected as being corrupt. Assuming the user selected OPTIONS to peruse the next frame in the sequence, Desktop 6(C) show the next frame which is also corrupted. If the user then selects the forward (Next Contrasting Frame) button, Desktop 6(D) shows the video scans up to the first frame after the last corrupted frame (a good frame) in the current sequence of corrupted frames.

If the user then selects an area within the video window, the presentation continues. Desktop 6(E) shows the video continues playing and then the user, while the video plays, selects the forward button (Next Contrasting Frame) to scan to the next corrupted frame. A message 72 appears which indicates no corrupted frames exist between the current point in the video and the end of the video with respect to the current forward direction. The user can clear the message with an ESC key or mouse selection. If the video had been playing in reverse direction and no corrupted frames existed between the current place in the video and the start of the video (while selecting the reverse (Previous Contrasting Frame) button), then a message such as "INTACT TO START" would have displayed. Similarly, if the video was playing through corrupted frames while a forward or reverse button was pressed, and all frames through end were also corrupted, a message such as "CORRUPTED TO END" or "CORRUPTED TO START" would display. Desktop 6(F) shows the user cleared the message while the video continues to play.

As before, it is important to note that a certain amount of corruption of the information may be acceptable to certain users and in certain circumstances. How much corruption is acceptable is thus to be determined by the user. Jumping (i.e. Next Contrasting Frame/Previous Contrasting Frame) through frame fidelity sequence is performed by comparing the user preference with the Data Loss Table maximum frequency. Thus, the perused video reflects the user preference instantly and dynamically.

Referring now to FIG. 7(A)–7(F), an alternative set of desktops is shown, desktops 7(A) through 7(F). The present invention is invoked with either a command from a command line or launched from a customary graphical interface. Upon invocation, Desktop 7(A) shows a panel result with another set of functions available. At initial startup, there are no bars yet shown in the window.

As with the example of FIGS. 6(A)–6(F), the window can be resized so that the video image will be scaled appropriately based on the panel and window size. Both axes will be labeled with the last used units and values. The user uses an OPTIONS option to select a digital file for view. As mentioned, a variety of user interface embodiments may be implemented without departing from the spirit of the invention. Special keyboard and/or hot key functions can accompany the mouse operated menus.

Also as before, OPTIONS provides means of selecting a file to view. When a source video file is selected, this file and the associated data reference table are read. The data reference table is used to color code bars 74 so there is a means to identify if there is information loss even though there may not appear to be when viewing the video or hearing the sound. Every time-slice (i.e. video frame, sound snapshot) with a loss will display a specific colored bar, distinct from other bars.

Figure 7A:
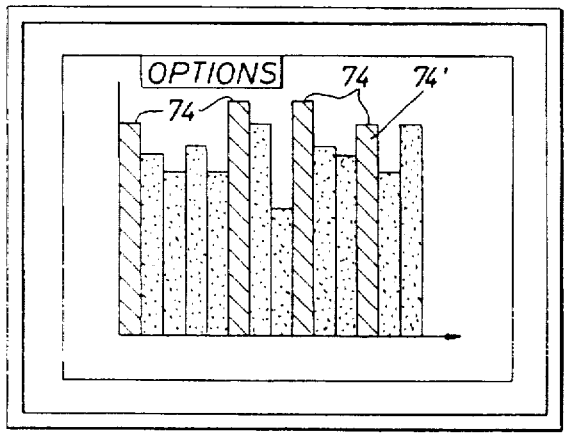
FIGS. 7(a)–7(f) a depiction of a series of screens illustrating a method of displaying the identification of lost information from either an audio or video signal.
Figure 7B:
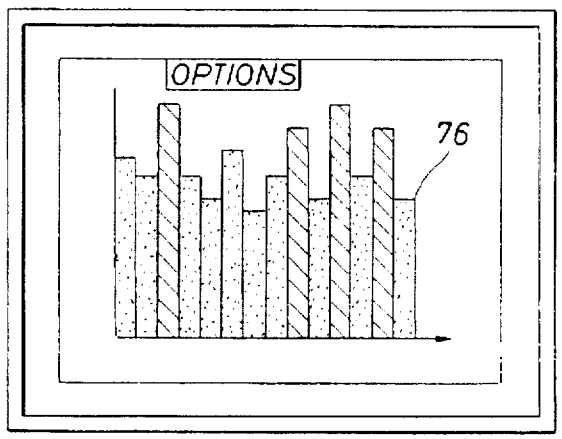
Figure 7C:
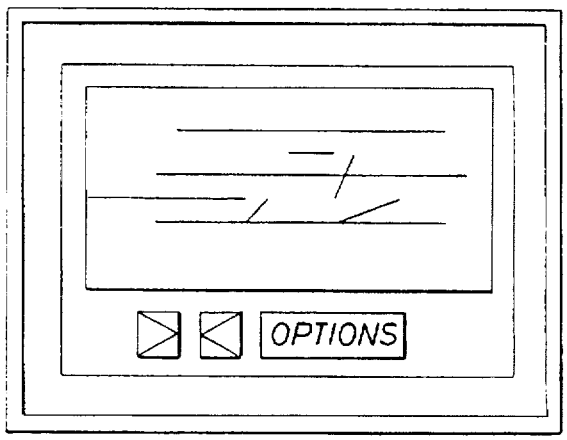
Figure 7D:
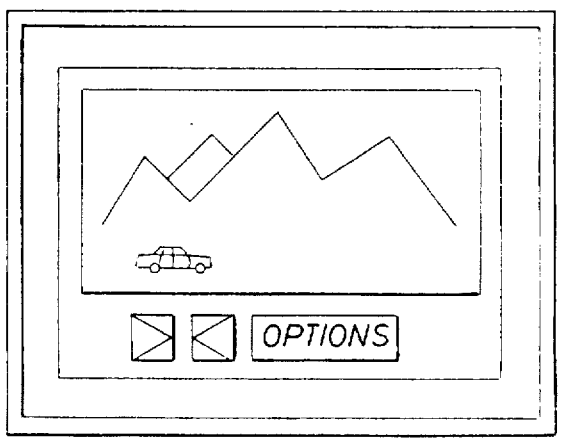
Figure 7E:
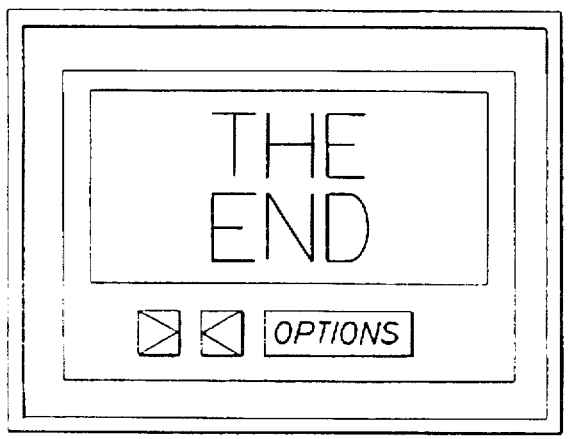
Figure 7F:
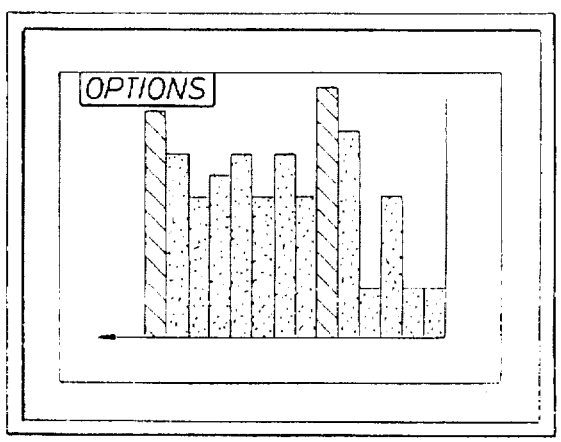

Various indicator embodiments are permitted. With reference to FIG. 7(A) shows a user has selected a video for diagnosis. Four time-slices 74 are shown as containing a loss of information with respect to the Nyquist rate. Desktop 7(B) shows the user selected the arrow head to scroll forward in samples. The arrowheads dynamically change to facilitate matter not shown at either end of the bar graph. If in Desktop 7(A), the user selected the 74' bar with the mouse, the Desktop 7(C) would display showing the associated corrupted video frame. The video may be perused (forward or reverse, fast or slow) in the conventional manner (using OPTIONS). Of course, keyboard commands and/or hot keys are implemented as supplements for all interfaces described. OPTIONS should permit a next frame and previous frame function for individual frame perusal. If while in Desktop 7(B), the user select the 76 bar, the associated frame of fidelity is jumped to as shown in Desktop D.

The user can return to the bar graph at any time and an indicator will be positioned over the associated sample bar. If while in Desktop 7(D), the user remains playing the video and the video ends as usual, with or without data loss, then Desktop 7(E) may result, for example. The user is able to transpose directly back to Desktop 7(F) at any time to the associated sample bar. Desktop 7(F) shows the user went back to the bar graph on the last frame of the video.

Logic Flow

FIGS. 8A through 8D, inclusive, depict a preferred embodiment of the logic involved in carrying out the present invention. It will be understood by those of skill in the art that the present invention is preferably carried out within the processor 12 but is not so limited.

Figure 8A:
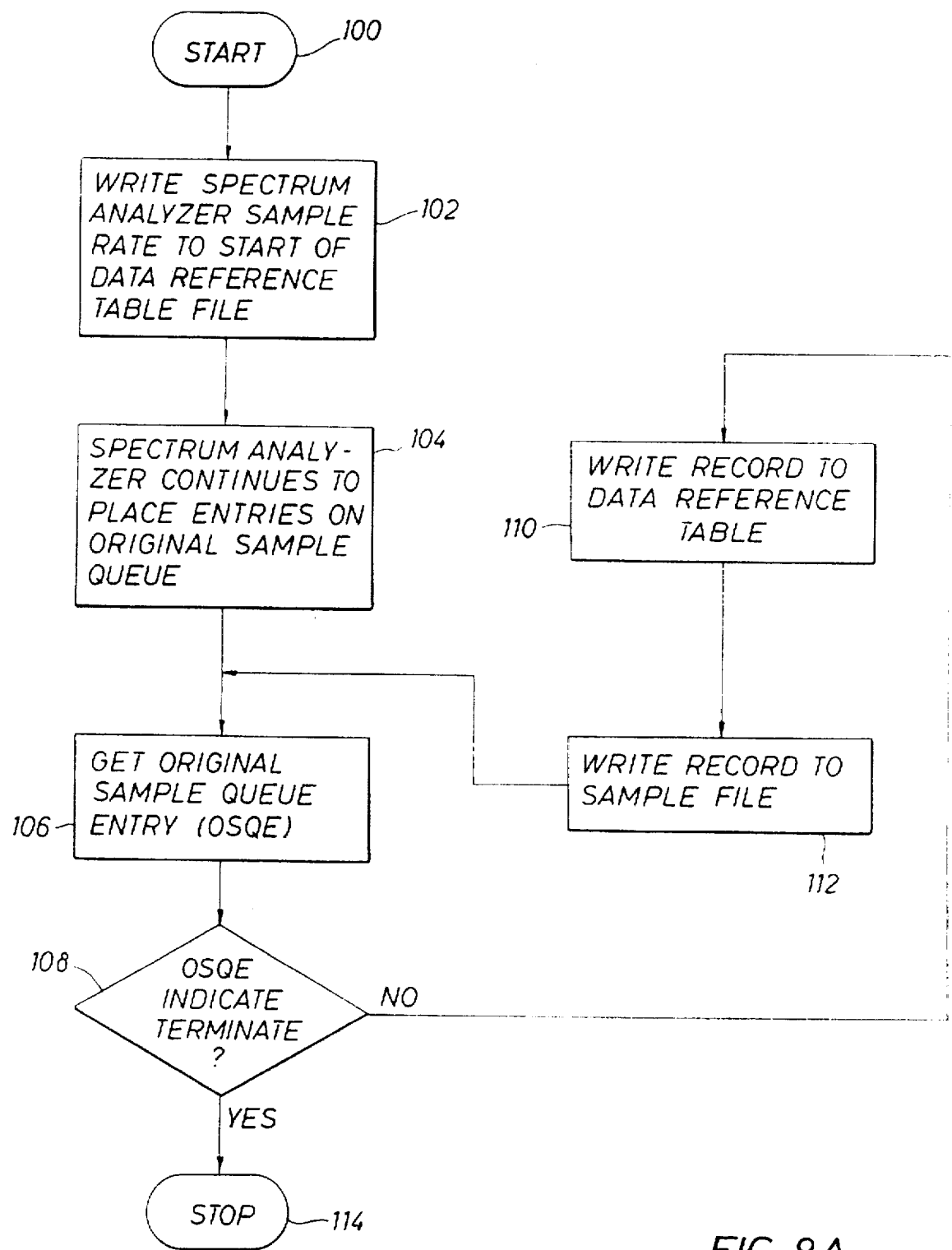
FIGS. 8A–8D are a logic flow diagram illustrating a preferred embodiment of carrying out the present invention.

Beginning with FIG. 8A, the process is started by block 100 in the conventional fashion. First, the actual sampling rate ($S_{SA}$) of the comprehensive sampler 42 is written to the data reference table 48 in block 102. Throughout the process, the spectrum analyzer continues to sample and digitize the analog signal 40 and to deliver samples to the original sample queue 44, as shown in block 104. The remaining steps read the oldest sample in the queue (step 106), determine if the sampling is complete (step 108) and write data to the data reference table 48 (step 110) and the sample file 50 (step 112) with the data structure previously described.

Figure 8B:
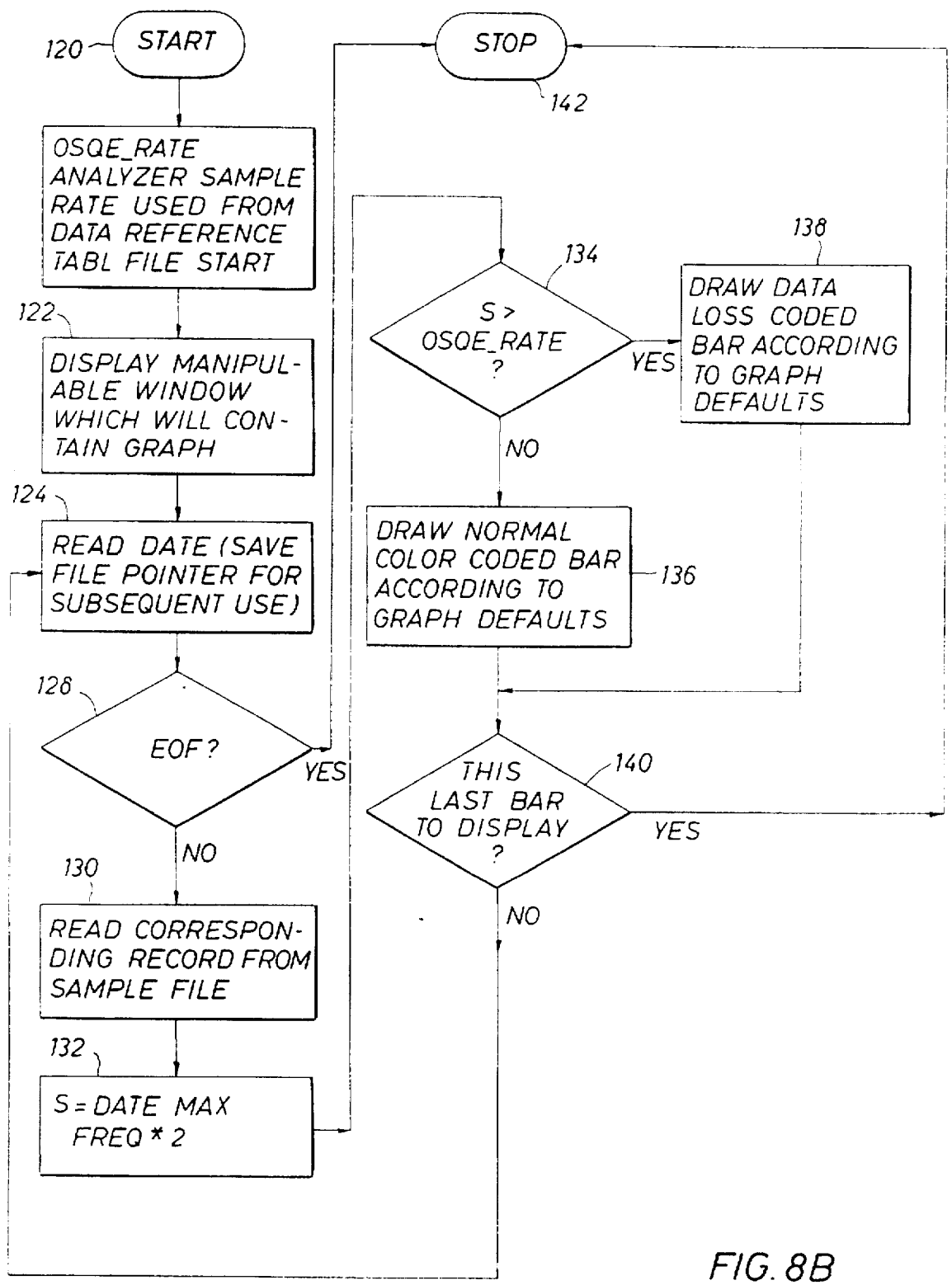

Next, FIG. 8B depicts the process of identifying and drawing the occurrence of data loss for later viewing and manipulation. After starting the procedure at step 120, step 122 initially sets a register entitled OSQE_RATE to the value written in step 102 (FIG. 8A). This value is $S_{SA}$, the sample rate of the spectrum analyzer, and is located at the start of the data reference table. Next, step 124 displays a user selectable default window which is manipulable by the user and which will contain the graphic display of the analog signal.

In step 126, the next entry in the data reference table, designated herein as DRTE, is read. As previously described, the DRTE comprises $F_{max}$ and the sample file offset, and the sample file offset is saved in step 126 for later use. Step 128 determines if the last DRTE has been read and, if it has, the procedure is stopped at step 142; if not, the process continues at step 130.

Step 130 reads the record from the sample file 50 which corresponds to the DRTE from step 126. The remainder of the steps of the procedure of FIG. 8B determine and display the loss of information from the analog signal. Step 132 sets a register designated S to value that is two times $F_{max}$ read in step 126. If step 134 determines that the value of S is greater than OSQE_RATE from step 122 (the actual sampling rate of the spectrum analyzer), the data loss is displayed to the window displayed in step 124. This is preferably shown as a color coded bar on a bar graph showing individual time-slices. If the actual sampling rate is greater than the Nyquist rate, then a normal default color bar is drawn in step 136. Finally, step 140 determines if the last bar has been displayed, and either returns to read the next entry in the data reference table or concludes the procedure.

Figure 8C:
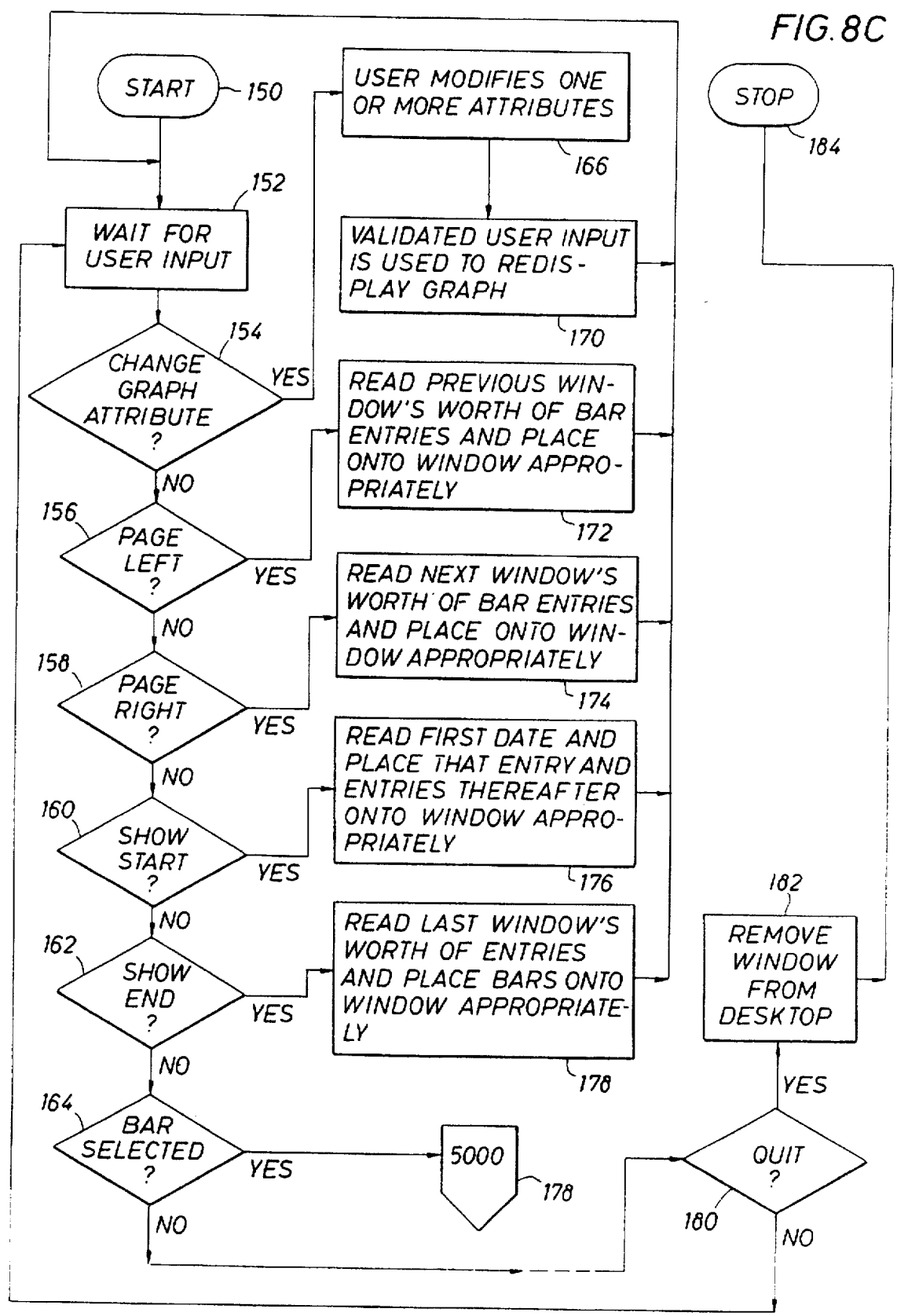
Figure 8D:
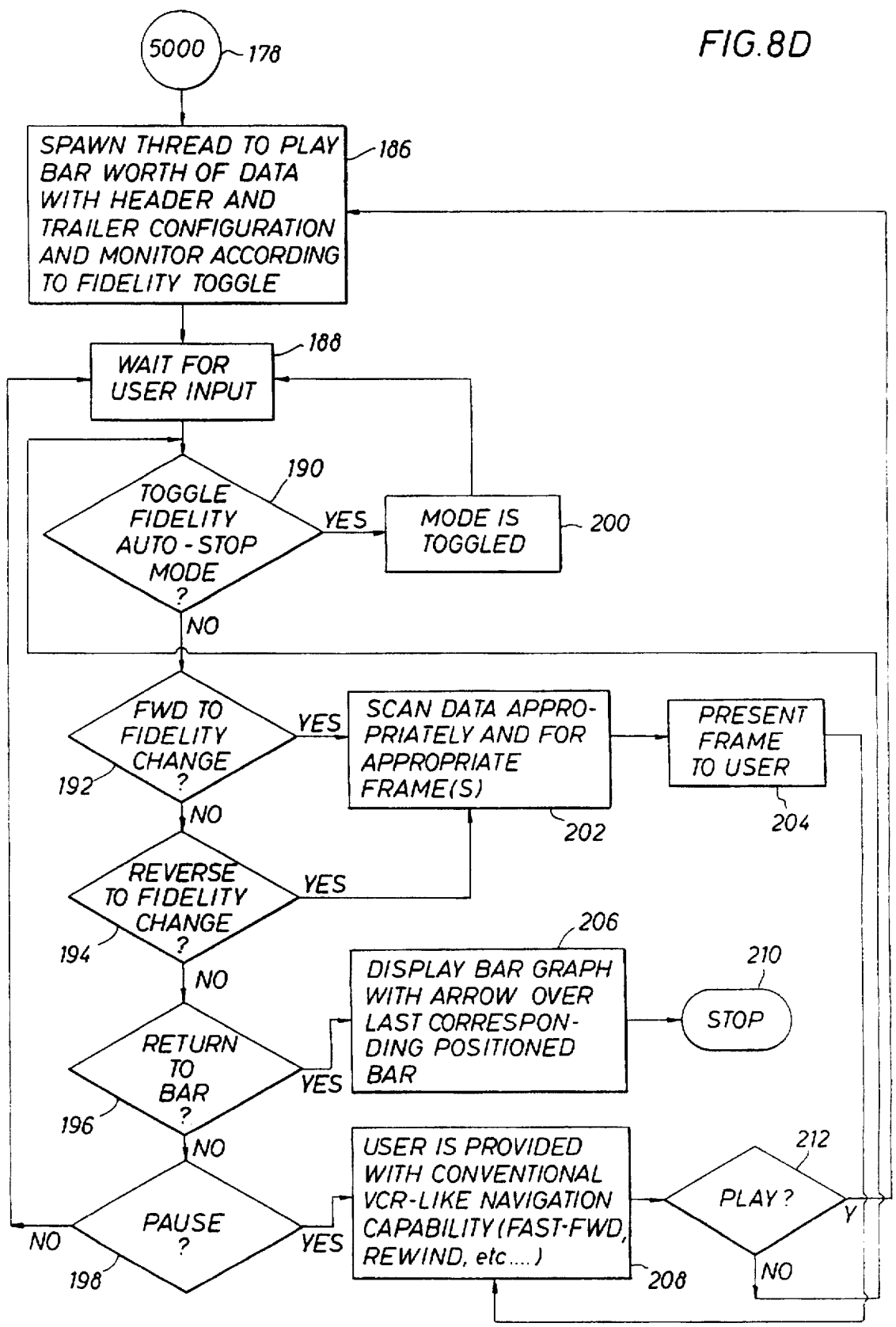

Now that data loss has been determined and marked throughout the digitized analog signal, FIGS. 8C and 8D permit user review and manipulation of the display. Those of skill in the art will recognize that other alternatives for review and manipulation are possible and fully within the scope of the present invention.

Finally, FIGS. 8C and 8D depict a preferred technique of navigating the display of the signal. The process begins at step 150 and then awaits activating by a user at step 152, in essence a pause. Then, a series of queries direct the user alter the attributes of the display in step 154 or to make gross changes in the display in steps 156, 158, 160, and 162, as shown. If the user chooses to manipulate one or more attributes of the graph, the step 166 offers the routine to modify the attributes and step 168 redraws the screen to show the effect of the modifications. Attributes include colorization or color, size, coordinate values, scaling, and other similar appearance attributes.

Each of steps 170, 172, 174, and 176 reads an entire window's worth of graphical display information and displays that information appropriately. Then, after each of these steps, as well as step 168, the process again pauses, awaiting further input from the user. If none of these options is elected, the process continues with step 164 to permit the selection of a particular bar for additional review. If no bar is selected by the user, the user is given the option in step 180 of removing the window from the desktop in step 182 to clear the desktop for further work and stopping the process in step 184. If the user selects a bar for further review, the process continues with the steps shown in FIG. 8D.

Step 186 spawns an asynchronous thread of execution, a process that simultaneously executes as the remainder of FIG. 8D continues. The step 186 continues to play through the stored sample data while simultaneously monitoring for user defined operations. The steps following, i.e., step 188 on, are options that a user can select while step 186 continues. Step 188 thus awaits actuation by the user.

Step 190 permits the user to toggle the fidelity toggle (on or off; off is default) for auto-stop which, if selected, is done in step 200. With the fidelity toggle in auto-stop mode (on), the playing as a result of step 186 automatically stops at the next change in fidelity (i.e., time-slice in which no data was lost to a time-slice in which data was lost or vice versa). Note that the execution in step 186 has continued, monitoring play according to the current auto-stop mode. Thus, the effect of step 200 is to modify or not effect the continuous execution of step 186.

The user is permitted in step 192 to fast-forward to the next change in signal fidelity, either an unadulterated time-slice from a time-slice in which data was lost, or vice versa. Step 194 permits the same action in the reverse direction. In either case, data is scanned for the appropriate frame in step 202 and displayed in step 204. The user is then presented with conventional VCR-type viewing controls, such as fast-forward, and so on, in step 208.

Step 196 provides a memory capability for returning to display the bar graph with the arrow over the last corresponding positioned bar in step 206.

The user may invoke for steps 192, 194, and 196, while step 186 executes play or while play is in pause mode.

Step 198 is designated as a "pause" selection. This step preempts or interrupts the continuous execution of step 186, in essence a "freeze frame." If the user selects the "pause" option, he is then presented with the conventional VCR-type controls in step 208 for viewing the display. With pause selected, the display remains at the same screen while the system carries out the selected navigation, i.e. fast forward. Without pause selected, the user will view the display fast forwarding through the sequential data from the sample file. One of the VCR-type controls in step 208 permits the play option in step 212, which continues the execution of step 186.

The principles, preferred embodiment, and mode of operation of the present invention have been described in the foregoing specification. This invention is not to be construed as limited to the particular forms disclosed, since these are regarded as illustrative rather than restrictive. Moreover, variations and changes may be made by those skilled in the art without departing from the spirit of the invention.

We claim:

1. A method of processing an analog signal in digital form comprising the steps of:
   a. sampling an analog signal at a predetermined sampling rate as a digital signal comprising a plurality of data bits;
   b. temporarily storing the samples from step a. as digital elements in a register comprising a first-in-first-out queue, each digital element representing a configurable time-slice;
   c. identifying the maximum frequency within each of the samples from step a.;
   d. developing a marker for each of the samples stored in step b., the marker identifying portions of the analog signal that were sampled below the Nyquist rate, indicating loss of the analog signal in the sampling process, or at or above the Nyquist rate, indicating no loss of the analog signal in the sampling process;
   e. storing the samples in memory with a marker corresponding to each sample;
   f. for each sample having an associated marker indicating loss of analog signal in the sampling process, writing an offset to a data loss table of the first byte in that sample;
   g. displaying the analog signal on a graphical user interface; and
   h. presenting a diagrammatic representation depicting fidelity of the sampled signal.

2. The method of claim 1, further comprising the step of transposing between a presentation of an associated analog signal and a presentation of a diagramatic representation depicting fidelity.

3. The method of claim 1, wherein the portions of the analog signal that were sampled at a frequency below the Nyquist rate are displayed contrasting with the portions of the analog signal that were sampled at a frequency at or above the Nyquist rate.

4. The method of claim 1, further comprising the step of scanning an analog signal presentation for the next change in fidelity.

5. The method of claim 1, further comprising the step of spawning an asynchronous thread to present the analog signal by using original samples with corresponding markers stored in step 1.e.

6. The method of claim 5, further comprising the step of automatically interrupting the asynchronous thread at a change in fidelity.

7. A system for processing an analog signal comprising:
   a. means for sampling the analog signal at a predetermined sampling rate into a plurality of discrete time-slices;
   b. a register comprising a first-in-first-out queue, for storing the sampled analog signal as configurable time-slices:
   c. means for generating a marker identifying a loss of information in the analog signal in any of the time-slices, defining an adulterated sample when information is lost and an unadulterated sample when no information is lost;
   d. means for storing the sampled signal and the marker;
   e. a data loss table for storing an offset of the first byte in each sample having an associated marker indicating loss of analog signal in the sampling process;
   f. means for generating a bar graph, each bar of the graph corresponding to a time-slice;
   g. means for displaying the analog signal on a graphical user interface; and
   h. means for transposing between a presentation of an associated analog signal and a presentation of a diagrammatic representation depicting fidelity.

8. The system of claim 7, further comprising means for displaying images contrasting portions of the analog signal that were sampled at a frequency below the Nyquist rate with portions of the analog signal that were sampled at a frequency at or above the Nyquist rate.

9. The system of claim 7, further comprising means for scanning an analog signal presentation for the next change in fidelity.

10. The system of claim 7, further comprising means for spawning an asynchronous thread to present the analog signal by using original samples with corresponding stored markers.

11. The method of claim 5, further comprising the step of interrupting the asynchronous thread with a user selectable input.

12. The system of claim 11, further comprising means for interrupting the synchronous thread with a user selectable input.

13. The system of claim 6, further comprising means for automatically interrupting the asynchronous thread at a change in fidelity.

* * * * *